(12) United States Patent
Shimizu

(10) Patent No.: US 6,809,407 B2
(45) Date of Patent: Oct. 26, 2004

(54) SEMICONDUCTOR DEVICE

(75) Inventor: Shinya Shimizu, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/285,286

(22) Filed: Oct. 31, 2002

(65) Prior Publication Data

US 2003/0089968 A1 May 15, 2003

(30) Foreign Application Priority Data

Nov. 1, 2001 (JP) ........................................ 2001-336185

(51) Int. Cl.⁷ .......................................... H01L 23/495
(52) U.S. Cl. .................. 257/673; 257/774; 257/706; 257/713; 257/712; 257/788; 257/787; 257/790; 257/793; 257/678; 257/680; 257/683; 257/699; 257/701; 257/702; 257/798; 257/684; 257/738; 361/761; 361/760; 361/771
(58) Field of Search ................................. 257/712, 788, 257/787, 790, 793, 678, 680, 683, 699, 701, 702, 798, 684, 738, 774, 776, 713; 361/761, 760, 771

(56) References Cited

U.S. PATENT DOCUMENTS 5,612,576 A * 3/1997 Wilson et al. ............... 257/788
5,721,450 A   2/1998 Miles
6,201,707 B1  3/2001 Sota
6,242,802 B1  6/2001 Miles et al.

* cited by examiner

Primary Examiner—Steven Loke
Assistant Examiner—Junghwa Im
(74) Attorney, Agent, or Firm—Hogan & Hartson, LLP

(57) ABSTRACT

A semiconductor device includes an electrically insulating board; conductive interconnections formed on a first face of the board and on a second face opposite to the first face; a semiconductor chip fixed to the board through at least the interconnections on the first face, said semiconductor chip having a semiconductor element electrically connected to the interconnections; a conductive bump formed on the second face of the board and electrically connected to the interconnections on the second face; and a first through-hole passing through the board to ventilate at least a part of the region between the board and the semiconductor chip.

6 Claims, 4 Drawing Sheets

*SEMICONDUCTOR DEVICE*

CROSS-REFERENCE TO RELATED APPLICATION

This application is based upon and claims the benefit of priority from the prior Japanese Patent Application No. 2001-336185, filed on Nov. 1, 2001, the entire contents of which are incorporated herein by reference.

BACKGROUND OF THE INVENTION

1. Field of the Invention

The present invention relates to a semiconductor device.

2. Related Background Art

A semiconductor wafer manufactured in front-end steps of a semiconductor fabrication process is diced and cut into individual semiconductor chips. These semiconductor chips are die-bonded and sealed with a molding resin.

A package for sealing a semiconductor chip protects a semiconductor element manufactured on the semiconductor chip. The package generally includes a lead for electrically connecting to a semiconductor element therein.

Because the functions of a semiconductor chip have been developed in recent years, the number of leads necessary for a package has increased, and thereby, the pitch between leads has decreased.

Therefore, a surface-mount-array package, that is, an SMA (Surface Mount Array) has been developed. Particularly, a BGA (Ball Grid Array) is typically used as an SMA package.

FIG. 5 is a sectional view of the package of a conventional semiconductor device 600 using a BGA. A semiconductor chip 10, whose semiconductor element is manufactured in the front-end steps of a semiconductor fabrication process, is mounted on an insulating board 20.

A metallic wiring (refer to FIG. 6) is patterned on the surface and back of the board 20. The metallic wiring is covered with a solder resist layer 50. The semiconductor chip 10 is bonded onto the solder resist layer 50 by an adhesive 40 and fixed to the board 20.

The semiconductor element formed on the semiconductor chip 10 is electrically connected to the metallic wiring by a metallic wire 15. A mold resin 25 seals the semiconductor chip 10 and metallic wire 15 to protect them.

A metallic ball 30 electrically connected to a metallic wiring is formed on the back of the board 20.

FIG. 6 is a further enlarged sectional view showing a part of the semiconductor device 600 in FIG. 5. In FIG. 6, it is shown that a metallic wiring 60*a* is formed on the surface of the board 20 and a metallic wiring 60*b* is formed on the back of the board 20.

The metallic wirings 60*a* and 60*b* are covered with the solder resist layer 50, and no void is present between the metallic wirings 60*a* and 60*b*.

A through-hole 65 is formed on the board 20. A metal is plated on the inside wall of the through-hole 65. Then, the solder resist layer 50 is filled in the center of the through-hole 65. The through-hole 65 acts as a VIA hole, and the metal on the inside wall of the through-hole 65 electrically connects the metallic wirings 60*a* and 60*b* each other.

The semiconductor device 600 shown in FIGS. 5 and 6 is surface-mounted on a printed board or glass board after it is completed. When the semiconductor device 600 is mounted on the printed board or the like, the semiconductor device 600 is heated through a reflowing process.

The adhesive 40 and solder resist 50, the adhesive 40 and semiconductor chip 10, and the solder resist 50 and metallic wiring 60*a* are usually in close contact with each other.

However, it is impossible to completely prevent voids from being formed between them.

When moisture is contained in these voids, a problem occurs that the moisture in these voids evaporates during the heating process of the semiconductor device 600 and hereby, the air pressure in the voids rises. As a result, the semiconductor chip 10 separates from the board 20.

Even when these voids are not present, the adhesive 40, solder resist 50, or board 20 may absorb moisture. Therefore, a problem also occurs that the moisture absorbed by the adhesive 40, solder resist 50, or board 20 evaporates during the heating process of the semiconductor device 600. Also thereby, the semiconductor chip 10 separates from the board 20.

Therefore, a semiconductor device is desired in which a semiconductor chip does not separate from a board during the heating process of a semiconductor device.

SUMMARY OF THE INVENTION

An embodiment of the present invention is provided with an electrically insulating board; conductive interconnections formed on a first face of the board and on a second face opposite to the first face; a semiconductor chip fixed to the board through at least the interconnections on the first face, said semiconductor chip having a semiconductor element electrically connected to the interconnections; a conductive bump formed on the second face of the board and electrically connected to the interconnections on the second face; and a first through-hole passing through the board to ventilate at least a part of the region between the board and the semiconductor chip.

DETAILED DESCRIPTION OF THE INVENTION

An embodiment of the present invention is described below by referring to the accompanying drawings. The embodiment does not restrict the present invention. Moreover, in the accompanying drawings, like components are designated by like numerals.

Figure 1:
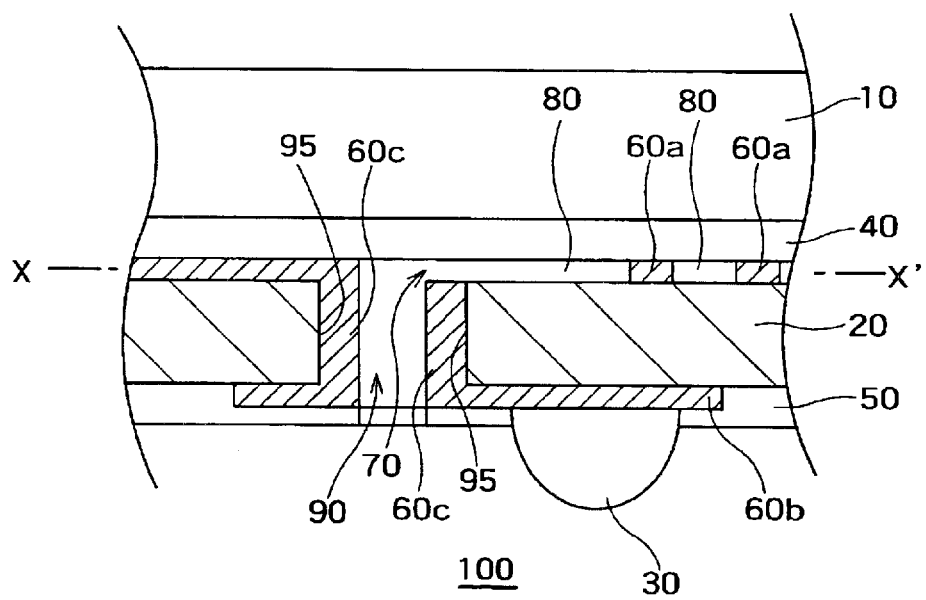
FIG. 1 is a locally enlarged view of a semiconductor device 100 of a first embodiment of the present invention.

FIG. 1 is a locally enlarged sectional view of a semiconductor device 100 of a first embodiment of the present invention.

The semiconductor device 100 is provided with a electrically insulating board 20. Metallic wirings 60*a* and 60*b* are patterned on the surface and back of the board 20, respectively.

The semiconductor device 100 is further provided with a semiconductor chip 10 on whose surface a semiconductor element (not illustrated) is formed. The semiconductor chip 10 is attached to the metallic wiring 60a by an adhesive 40 and fixed to the board 20. That is, a solder resist is not present between the semiconductor chip 10 and board 20, which is different from the case of a conventional semiconductor device 600. Therefore, the semiconductor chip 10 is fixed to the board 20 through the metallic wiring 60a provided on the surface of the board 20.

Therefore, a void is produced between the board 20 and adhesive 40. Thus, a space 80 facing the metal wiring 60a, the board 20 and adhesive 40 is formed between the board 20 and the adhesive 40.

A through-hole 90 passing through the board 20 to ventilate the space 80 between the board 20 and semiconductor chip 10 is formed on the board 20. A cutout 70 is formed by removing the metallic wiring between the board 20 and the adhesive 40 to connect the through-hole 90 to the space 80.

Moreover, a semiconductor element formed on the semiconductor chip 10 is electrically connected to the metallic wiring 60a or 60b by a metallic wire (not illustrated). The metallic ball 30 electrically connected to the metallic wiring 60b is formed on the back of the board 20. The semiconductor chip 10 is further sealed with a mold resin (not illustrated).

The board 20 uses an electrically insulating material such as glass, ceramic, or heat-resistant resin. The adhesive 40 uses adhesive polyimide or epoxy resin. It is preferable to use a filmy material instead of a pasty material for the adhesive 40 for maintaining the space 80. The metallic wirings 60a and 60b are made of a metal having a high conductivity, such as copper, aluminum, silver, gold or the like. The metallic ball 30 uses a material such as solder and the solder resist 50 uses a material which is areolar to a molten metal of metal ball 30.

Figure 2:
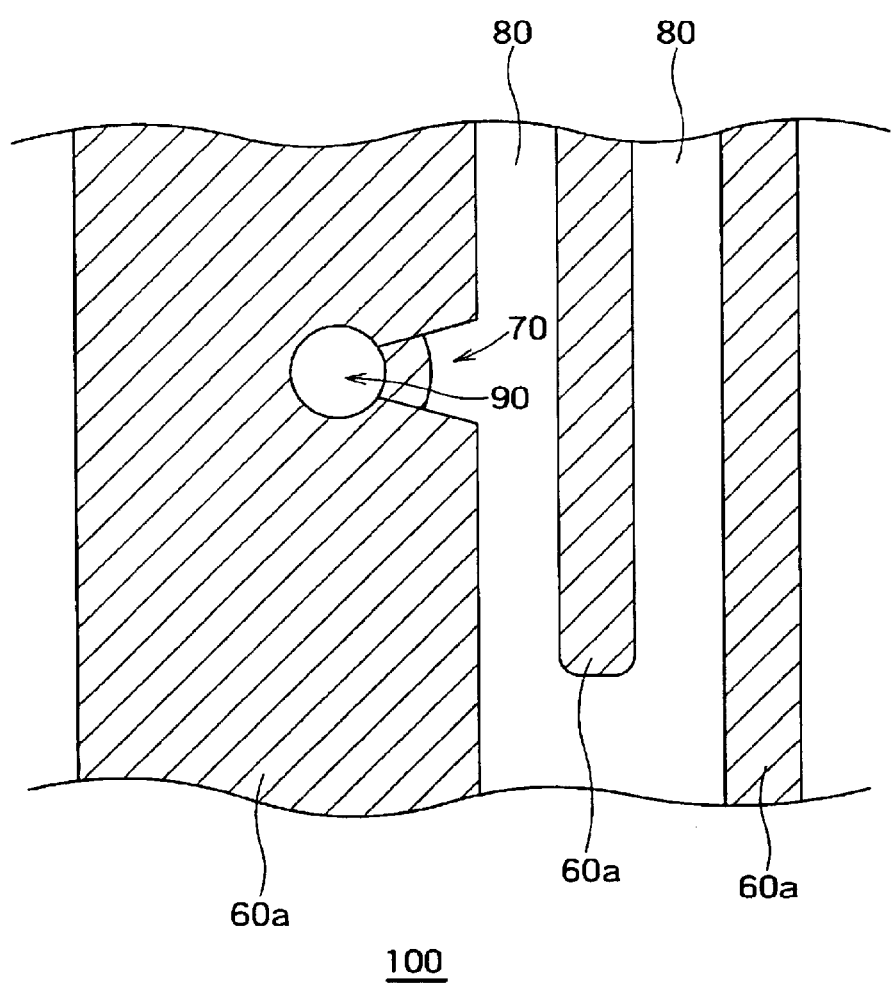
FIG. 2 is a locally enlarged top view of the semiconductor device 100 in FIG. 1 taken along the line X–X' of the semiconductor device 100.

FIG. 2 is a locally enlarged top view of the semiconductor device 100 in FIG. 1 taken along the line X–X' of the semiconductor device 100. It is understood that the cutout 70 is formed on a part of the circumference of the through-hole 90. The cutout 70 is provided by removing the metallic wiring 60a in the step of patterning the metallic wiring 60a on the surface of the board 20.

The through-hole 90 and cutout 70 connect the space 80 with outside air. Thereby, the air pressure in the space 80 is kept equal to outside air pressure.

Therefore, even when moisture is contained in the space 80, the air pressure in the space 80 does not rise during the reflowing process of the semiconductor device 100. Thereby, the semiconductor chip 10 is not separated from the board 20.

Moreover, even when the adhesive 40, solder resist 50, or board 20 absorbs moisture or the like, the moisture can flow the outside from the space 80 through the through-hole 90 and the cutout 70. Therefore, even in this case, the semiconductor chip 10 does not separate from the board 20 during reflowing process of the semiconductor device 100. Thus, this embodiment makes it possible to prevent a semiconductor chip in a semiconductor device from separating from a board by positively using a space present between the semiconductor chip 10 and the board 20.

It is possible to set a desiccant in the through-hole 90 or nearby the through-hole 90. Thereby, moisture or the like is forcibly removed.

The number of through-holes 90 and cutouts 70 and positions where they are formed depend on the pattern of the metallic wiring 60a. That is, it is attained by forming the proper number of through-holes 90 and the cutouts 70 at proper positions so that the space between the metallic wirings 60a connects with outside air but they are not closed.

The diameter of the through-hole 90 depends on the pattern of the metallic wiring 60a and the interval between adjacent metallic balls 30.

In recent years, however, the pattern of the metallic wiring 60a has become complicated and the interval between adjacent metallic balls 30 has decreased. Therefore, it is preferable that the diameter of the through-hole 90 is smaller.

When the diameter of the through-hole 90 is too small, the through-hole 90 may be closed because the through-hole 90 is filled with a metal due to plating when forming the metallic wirings 60a and 60b.

Therefore, it is preferable that the through-hole 90 has a diameter of 0.05 mm to 0.3 mm.

In the case of this embodiment, the shape of the through-hole 90 is circular. However, it is possible to optionally select the shape of the through-hole 90. Moreover, in the instant embodiment, the through-hole 90 is formed vertically to the surface or back of the board 20. However, the forming direction of the through-hole 90 is not restricted. Therefore, it is possible to form the through-hole 90 in a direction diagonally to the surface or back of the board 20.

Moreover, the size of the cutout 70 is not restricted but it depends on the diameter of the through-hole 90.

In the case of the semiconductor device 100 of this embodiment, a sidewall wiring 60c made of a metal which is the same as that of the metallic wiring 60a or 60b is formed on a sidewall 95 of the through-hole 90. Thereby, the metallic wirings 60a and 60b are electrically connected to each other by the sidewall wiring 60c.

That is, the through-hole 90 is used not only to connect the space 80 with the outside but also to electrically connect the metallic wirings 60a and 60b to each other.

Figure 3:
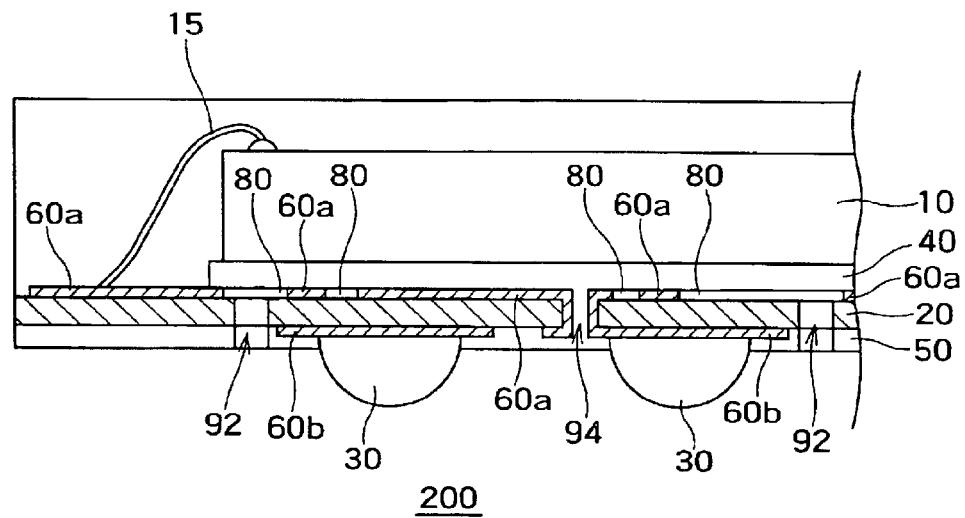
FIG. 3 is a locally enlarged sectional view of a semiconductor device 200 of a second embodiment of the present invention.

FIG. 3 is a locally enlarged sectional view of the semiconductor device 200 of the second embodiment of the present invention. In the case of the semiconductor device 200, two types of through-holes 92 and 94 used for different purposes are formed on the board 20.

The through-hole 92 connects the space 80 with the outside. The inside wall of the through-hole 94 is covered with a metal. Therefore, the through-hole 94 electrically connects the metallic wiring 60a with the metallic wiring 60b. Thus, even when the through-hole 92 and 94 used for different purposes are separately formed, the objectives of the present invention are achieved and the same effects as those of the first embodiment can be obtained.

The through-hole 94 is formed on the board 20 before plating for forming the metallic wirings 60a and 60b. Thereby, the metallic wirings 60a and 60b are electrically connected to each other.

The through-hole 92 is formed after plating and forming the solder resist layer. Therefore, the through-hole 92 is not closed by a metal and the solder resist. Thus, the through-hole 92 can keep remain connected with the space 80.

Figure 4:
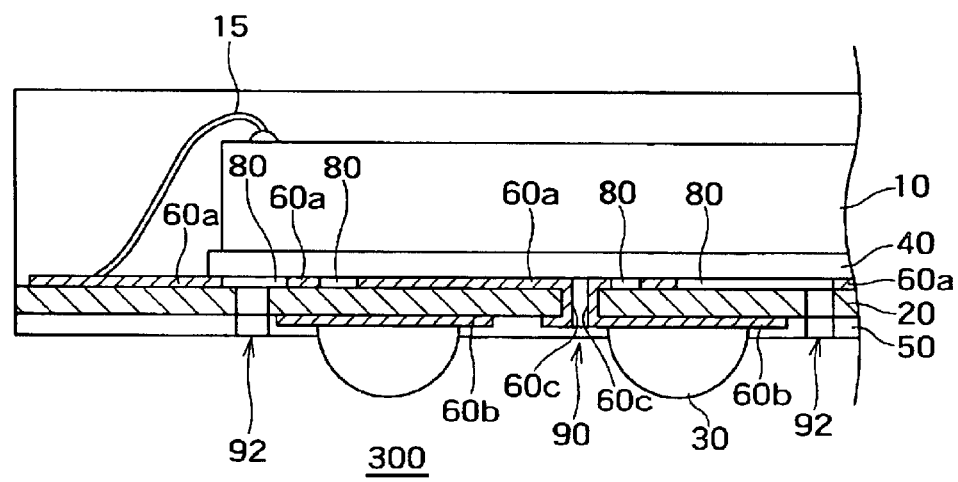
FIG. 4 is a locally enlarged sectional view of a semiconductor device 300 of a third embodiment of the present invention.
Figure 5:
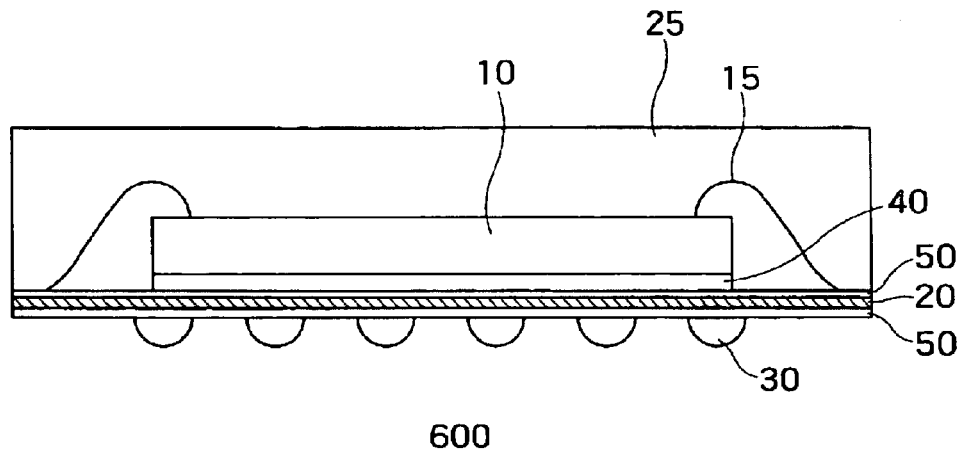
FIG. 5 is a sectional view of a conventional semiconductor device 600 using a BGA.
Figure 6:
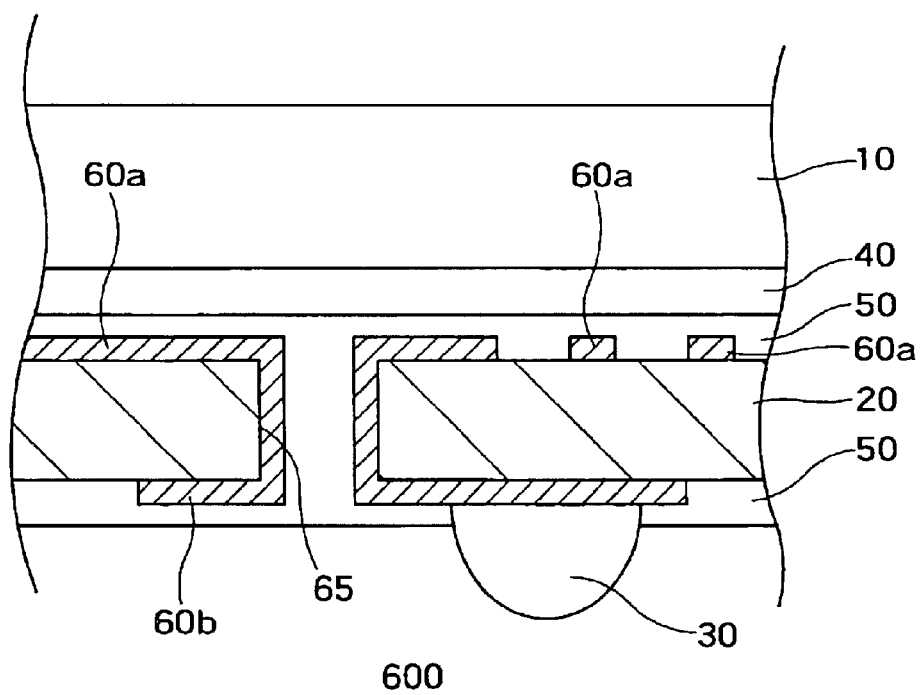
FIG. 6 is a local sectional view showing the further-enlarged semiconductor device 600 in FIG. 5.

FIG. 4 is a locally enlarged sectional view of a semiconductor device 300 of a third embodiment of the present invention. In the instant embodiment, the through-hole 90 of the first embodiment and the through-hole 92 of the second embodiment are formed on the board 20 together.

The through-hole 90 is formed on the board 20 before plating for forming the metallic wirings 60a and 60b and the through-hole 92 is formed on the board 20 after the plating. Therefore, the sidewall wiring 60c is formed on the sidewall of the through-hole 90 and no wiring is formed in the through-hole 92.

In the case of this embodiment, every through-hole can connect the space 80 with the outside. And some of the through-holes can selectively and electrically be connected between the metallic wirings 60a and 60b.

In the case of the first to third embodiments, the adhesive 40 is attached to the entire back of the semiconductor chip 10. However, it is also possible to apply an adhesive to only the upper face of the metallic wiring 60a and fix the semiconductor chip 10 to the board 20. In this case, the back of the semiconductor chip 10, metallic wiring 60, and board 20 face the space 80.

The first to third embodiments respectively use the board 20 having a two-layer wiring structure. However, it is possible to use a board having a wiring structure of three layers or more for the board 20. In this case, the board 20 has a plurality of insulating core materials (not illustrated). A metallic wiring is disposed between the insulating core materials through glass or epoxy resin. Thus, a board having a wiring structure of three layers or more can be formed.

When the board 20 has a wiring structure of three layers or more, spaces (not illustrated) are provide between the core materials. Wirings, which are formed between a plurality of core materials, and the core materials face the spaces. The through-holes 90, 92, or 94 connect the spaces with the outside. Thereby, when reflowing process is applied to a semiconductor device, it is possible to prevent the core materials from separating from each other.

In the case of the first to third embodiments, a semiconductor device uses an airtight sealing package made of a mold resin. However, it is possible that the semiconductor device of any one of the above embodiments uses a non-airtight sealing package.

According to the semiconductor device of any one of the above embodiments, the air pressure between a semiconductor chip and a board does not rise during reflowing process of a semiconductor device. Therefore, a semiconductor chip and a board in the semiconductor device are not separated from each other.

What is claimed is:

1. A semiconductor device, comprising:
    an electrically insulating board;
    first conductive interconnections formed on a first face of the board and on a second face opposite to the first face;
    a semiconductor chip fixed to the board through at least the first conductive interconnections on the first face, said semiconductor chip having a semiconductor element electrically connected to the first conductive interconnections;
    a conductive bump formed on the second face of the board and electrically connected to the first conductive interconnections on the second face; and
    a first through-hole passing through the board to ventilate at least a part of the region between the board and the semiconductor chip;
    wherein
    the board is formed by laminating a plurality of insulating layers,
    second conductive interconnections are formed between the plurality of insulating layers,
    a space faced with the second conductive interconnections and the plurality of insulating layers is present between the plurality of insulating layers, and
    the first through-hole connects with the space.

2. The semiconductor device according to claim 1, further comprising:
    a conductive material formed on the sidewall of the first through-hole to electrically connect the first conductive interconnections on the first face with the first conductive interconnections on the second face.

3. The semiconductor device according to claim 1,
    wherein the pattern of the first conductive interconnections formed on the first face includes a cutout obtained by removing a part of the first conductive interconnections around the first through-hole to connect the space to the first through-hole.

4. The semiconductor device according to claim 1, further comprising:
    a second through-hole passing through the board and filled with a conductive material for electrically connecting the first conductive interconnections on the first face with the first conductive interconnections on the second face.

5. The semiconductor device according to claim 1,
    wherein the first through-hole has a diameter of 0.05 mm to 0.3 mm.

6. The semiconductor device according to claim 1, further comprising:
    an adhesive provided between the first conductive interconnections and the semiconductor chip to attach the first conductive interconnections on the first face with the semiconductor chip and to fix the semiconductor chip to the board, said adhesive being film type;
    wherein said space faces the first conductive interconnections on the first face, the board, and the adhesive.

* * * * *